(12) United States Patent
Yoo et al.

(10) Patent No.: US 7,038,270 B2
(45) Date of Patent: May 2, 2006

(54) NONVOLATILE MEMORY DEVICE WITH A NON-PLANAR GATE-INSULATING LAYER AND METHOD OF FABRICATING THE SAME

(75) Inventors: Hyun-khe Yoo, Kyunggi-do (KR); Jeong-uk Han, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 6 days.

(21) Appl. No.: 10/420,237

(22) Filed: Apr. 22, 2003

(65) Prior Publication Data

US 2003/0211689 A1 Nov. 13, 2003

(30) Foreign Application Priority Data

May 7, 2002 (KR) ................. 10-2002-0025012

(51) Int. Cl.
*H01L 29/792* (2006.01)

(52) U.S. Cl. .................. 257/324; 257/321; 257/345

(58) Field of Classification Search ........... 438/201, 438/211, 257, 264, 266, 593, 594; 257/315, 257/316, 320, 321, 324, 345
See application file for complete search history.

(56) References Cited

U.S. PATENT DOCUMENTS

| | | | | |
|---|---|---|---|---|
| 4,949,140 A | * | 8/1990 | Tam | 257/316 |
| 4,958,321 A | * | 9/1990 | Chang | 365/185.3 |
| 5,262,987 A | * | 11/1993 | Kojima | 365/185.32 |
| 5,338,954 A | * | 8/1994 | Shimoji | 257/326 |
| 5,379,253 A | * | 1/1995 | Bergemont | 365/185.02 |
| 5,691,560 A | * | 11/1997 | Sakakibara | 257/316 |
| 5,838,616 A | * | 11/1998 | Randazzo | 365/185.14 |
| 5,856,222 A | | 1/1999 | Bergemont et al. | |
| 5,960,285 A | * | 9/1999 | Hong | 438/264 |
| 6,323,517 B1 | * | 11/2001 | Park et al. | 257/326 |
| 6,580,124 B1 | * | 6/2003 | Cleeves et al. | 257/331 |
| 6,828,618 B1 | * | 12/2004 | Baker et al. | 257/311 |

* cited by examiner

*Primary Examiner*—Mark V. Prenty
(74) *Attorney, Agent, or Firm*—F. Chau & Associates, LLC

(57) ABSTRACT

A non-volatile memory device with a non-planar gate insulating layer and a method of fabricating the same are provided. The device includes a tunnel insulating pattern, a charge storage layer, an upper insulating layer and a control gate electrode which are sequentially stacked. A lower insulating pattern, which is covered with the charge storage layer and thicker than the tunnel insulating pattern, is disposed on the semiconductor substrate beside the tunnel insulating layer. A heavily doped region including impurities of the same type as the semiconductor substrate is disposed in the semiconductor substrate under the tunnel insulating pattern.

12 Claims, 7 Drawing Sheets

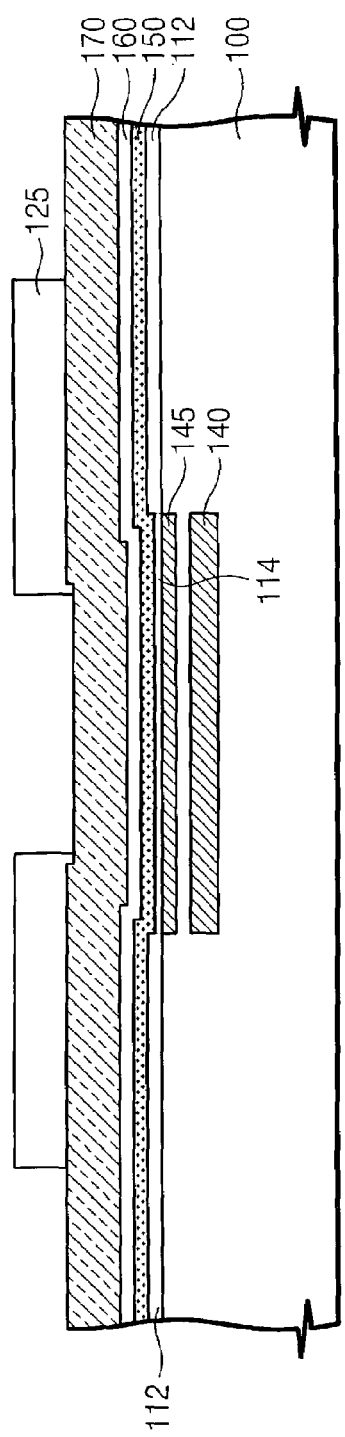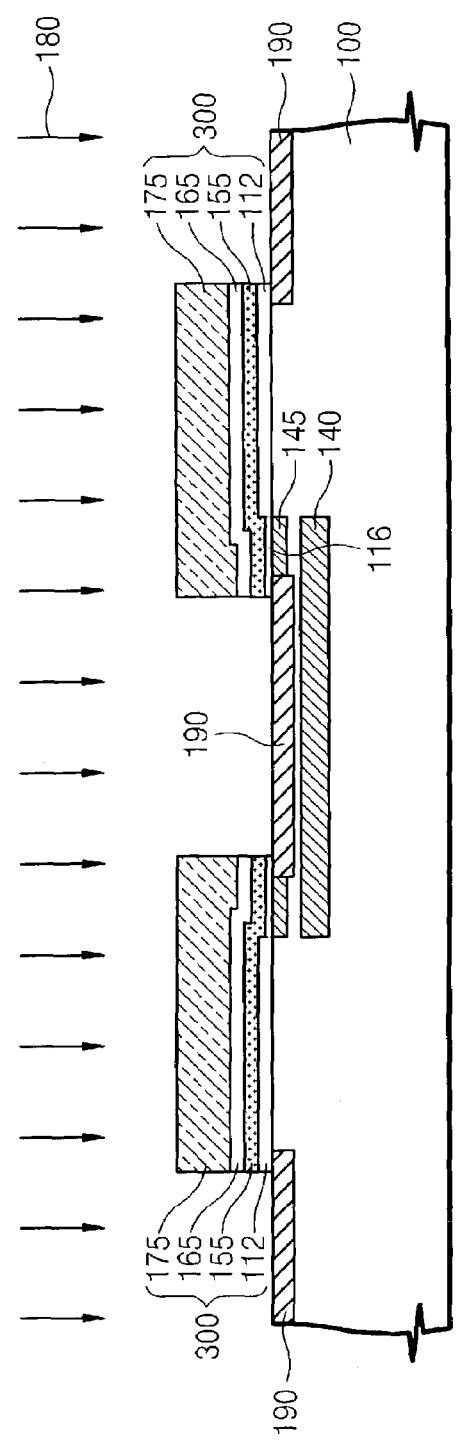

NONVOLATILE MEMORY DEVICE WITH A NON-PLANAR GATE-INSULATING LAYER AND METHOD OF FABRICATING THE SAME

BACKGROUND

1. Field of the Invention

The present invention generally relates to a semiconductor device and a method of fabricating the same and, more specifically, to a nonvolatile memory device with non-planar gate insulating layer and method of fabricating the same.

2. Discussion of Related Art

A non-volatile memory device can maintain stored information when power is no longer supplied to the device. As the tendency of making electronic devices smaller, e.g., pocket-sized and portable PCs, there is an increase in the demand for non-volatile memory devices. The most popular and widely used non-volatile memory device is a FLASH memory device including a floating gate.

A large potential difference of about 10V or more is used for programming and erasing the non-volatile memory of a FLASH memory device. The programming and erasing steps are used for changing information stored in a cell transistor of the FLASH memory. In addition, the FLASH memory having the floating gate includes a plurality of pumping circuits at a peripheral region to generate a high potential difference of more than 10V. The difficulty in fabricating a FLASH memory device is that transistors and interconnections need to formed under the above potential difference to avoid a breakdown. A SONOS-type non-volatile memory device have been studied to avoid this problem. A SONOS-type non-volatile memory device uses an insulating layer having a trap site, e.g. a silicon nitride layer, as a charge storage layer.

FIGS. 1–3 show a non-volatile memory device in a SONOS structure and a method of operating the same in accordance with the prior art.

Referring to FIGS. 1–3, a gate pattern is disposed on a semiconductor substrate 10. The gate pattern comprises a gate insulating layer 20 and a control gate electrode 30, which are sequentially stacked on the semiconductor substrate 10. Source/drain regions 42 and 44 are disposed in the semiconductor substrate 10 on opposite sides of the gate pattern.

The gate insulating layer 20 comprises a lower insulating layer 22, a charge storage layer 24 and an upper insulating layer 26 which are sequentially stacked. Typically, the lower insulating layer 22, the charge storage layer 24 and the upper insulating layer 26 are formed using silicon oxide, silicon nitride, and silicon oxide, respectively.

The semiconductor substrate 10 includes impurities of a first conductivity type (e.g., p-type) and the source/drain regions 42 and 44 include impurities of a second conductivity type (e.g., n-type). In this case, the concentration of impurities of the source/drain regions 42 and 44 are higher than the concentration of impurities of the semiconductor substrate 10.

FIGS. 1 and 2 are cross-sectional views showing an effect of a bias applied during the programming and erasing steps of a non-volatile memory device. For a brief explanation, only a case that the cell transistor is n-type MOSFET will be considered hereinafter. Referring to FIG. 1, as a voltage applied to the control gate electrode 30 increases, an inversion region 54 and a depletion region 52 are formed at a channel region. As a voltage applied to the drain region 44 increases, the inversion region 54 is pinched off from the drain region 44. Thus, the depletion region 52 is interposed between the drain region 44 and the inversion region 54. In addition, the source region 42 is grounded.

Under this condition, a hot carrier injection may occur between the drain region 44 and the inversion region 54. The hot carrier injection is electrons being injected into the charge storage layer 24. The injected electrons may produce a trapping region 60 in the charge storage layer 24. The electric potential of the channel region is affected by whether or not the trapping region 60 exists during a reading. Thus, the hot carrier injection can be used for the programming of a cell transistor.

Referring to FIG. 2, a positive voltage is applied to the drain region 44 and a negative voltage is applied to the control gate electrode 30. The source region 42 and the semiconductor substrate 10 are grounded. Under this condition, the voltage of the drain region 44 creates a depletion region 56 in the semiconductor substrate 10 around the drain region 44.

Under the above voltage condition, hot holes having enough energy to surmount a potential barrier of the lower insulating layer 22 may be formed. The hot holes may combine with electrons of the trapping region 60 and may be used for an erasing process for removing the trapping region 60 which is formed in the charge storage layer 24. However, the trapping region 60 may not be sufficiently removed by the erasing process and a residual trapping region 62 may be formed in place of the trapping region 60.

Referring to FIG. 3, the trapping region 60 offsets a voltage applied to the control gate electrode 30 during a subsequent programming process. Thus, if the same voltage is applied to a subsequent programming, an abnormal trapping region 64, which is wider than the trapping region 60, is formed in the charge storage layer 60. The abnormal trapping region 64 results in the residual trapping region 62 remaining after the erasing as explained in FIG. 2. The residual trapping region 62 decreases the on-current of a cell transistor, and thereby gives rise to misjudgment on stored information.

FIG. 4 is a graph showing degradation of the nonvolatile memory device of FIGS. 1–3 during the programming and erasing.

Referring to FIG. 4, when the cell transistor is programmed, electrons are injected into the trapping region 60 of the charge storage layer 24. Thus, the reading current of a cell transistor is measured less than a reference current $I_{ref}$ at the reference voltage $V_{ref}$ (4). In addition, when the cell transistor is normally programmed, the trapping region 60 is removed. Therefore, reading current of the cell transistor is measured more than $I_{ref}$ at $V_{ref}$ (1). However, the residual and abnormal trapping regions 62 and 64 of the FIGS. 2 and 3, which result from an incomplete erasing, cause a problem that a threshold voltage $V_{th}$ of the cell transistor is increased when the $V_{th}$ is measured after the erasing (2 and 3). In addition, repetition of the programming and erasing give rise to excessive shift of the threshold voltage, so that the reading current of the erased cell transistor may be less than $I_{ref}$ at $V_{ref}$ (3). An insufficient current may cause a wrong reading of the stored data, rendering the semiconductor device defective.

Therefore, there is need for non-volatile memory devices that decrease the operation voltages during the programming and erasing processes of the non-volatile memory device.

SUMMARY OF THE INVENTION

An embodiment of the present invention provides a non-volatile memory device that prevents a change of a threshold voltage.

Another embodiment of the present invention provides a non-volatile memory device and method that decreases operation voltages of programming and erasing.

In accordance with embodiments of the present invention, a non-volatile memory device and method is provided in which a tunnel insulating layer adjoing a drain region is thinner than a lower insulating pattern adjoing a source region.

The memory device includes a charge storage layer stacked on a semiconductor substrate of a first conductivity type and also includes a lower insulating pattern and a tunnel insulating pattern which are interposed between the charge storage layer and the semiconductor substrate. A control gate electrode is disposed on the charge storage layer. The control gate electrode is placed over the lower insulating pattern and the tunnel insulating pattern. Moreover, an upper insulating layer is interposed between the control gate electrode and the charge storage layer. A heavily doped region of a first conductivity type is disposed in the semiconductor substrate under the tunnel insulating pattern. The tunnel insulating pattern is thinner than the lower insulating pattern and disposed at a side thereof.

Source/drain regions of a second conductivity type may be further disposed in the semiconductor substrate on opposite sides of the control gate electrode, respectively. The source/drain regions preferably have a lightly doped drain (LDD) structure. In addition, the tunnel insulating pattern is disposed adjoing the drain region.

Preferably, the heavily doped region of the first conductivity type is disposed to surround a lower sidewall of the drain region. In addition, a lightly doped region of a first conductivity type may be formed in the surface of the semiconductor substrate under the tunnel insulating pattern.

The lower insulating pattern and the charge storage layer are preferably a silicon oxide layer and a silicon nitride layer, respectively. The upper insulating layer is perferably a silicon oxide layer or a high-k dielectric layer.

A method of forming the device comprises the following. A lower insulating pattern is formed on the semiconductor substrate of a first conductivity type. Next, a tunnel insulating layer is formed on the semiconductor substrate beside the lower insulating pattern. A charge storage layer, an upper insulating layer and a gate conductive layer are sequentially formed on an entire surface of the semiconductor substrate including the tunnel insulating layer. Afterward, the gate conductive layer is patterned to form a control gate electrode which is placed over the lower insulating pattern and the tunnel insulating layer and parallel to the lower insulating pattern. It is the property of forming the tunnel insulating layer that the thickness thereof is thinner than that of the lower insulating pattern.

Forming the lower insulating pattern preferably comprises the following. A lower insulating layer and a photoresist pattern are sequentially formed on the semiconductor substrate and then using the photoresist pattern as an etching mask, the lower insulating layer is etched. Then, the photoresist pattern is removed.

Before forming the tunnel insulating layer, a heavily doped region of a first conductivity type is preferably formed in the semiconductor substrate under the tunnel insulating layer. In addition, before forming the tunnel insulating layer, a lightly doped region of a first conductivity type may be formed in the semiconductor substrate under the tunnel insulating layer.

The lower insulating pattern and the tunnel insulating layer are preferably formed of a silicon oxide layer. The upper insulating layer is preferably formed of a silicon oxide layer or a high-k dielectric layer. In addition, the charge storage layer is perferably formed of a silicon nitride layer and a step of forming the silicon nitride layer perferably uses nitrification including a chemical vapor deposition or a thermal process. The nitrification is perferably performed using gases including nitrogen, e.g., $N_2O$ or NO gases.

In addition, the upper insulating layer, the charge storage layer, the lower insulating layer and the tunnel insulating layer may be patterned after forming the control gate electrode.

BRIEF DESCRIPTION OF THE DRAWINGS

FIGS. 5 through 9 are cross-sectional views showing a method of fabricating a non-volatile memory device in accordance with a preferred embodiment of the present invention.

DETAILED DESCRIPTION OF PREFERRED EMBODIMENTS

Figure 1:
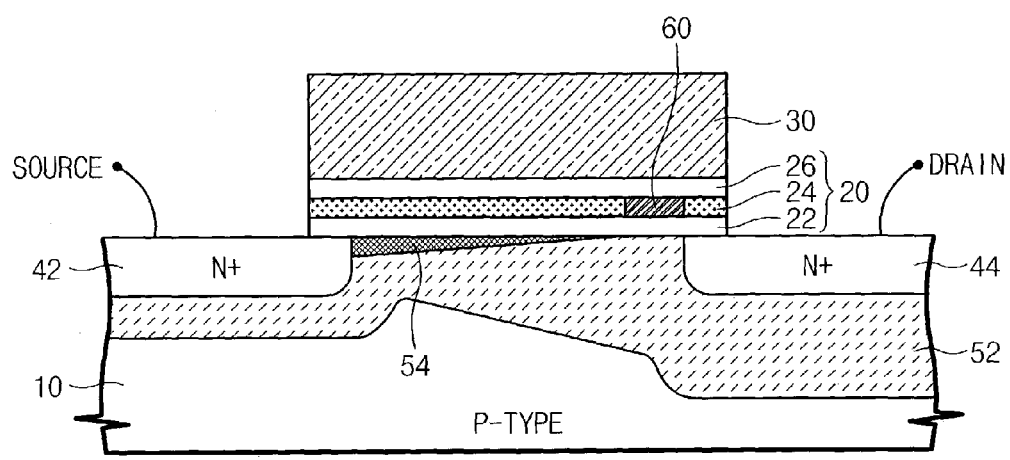
FIGS. 1 through 3 show a non-volatile memory device having SONOS structure and an operating method thereof in accordance with the prior art.
Figure 2:
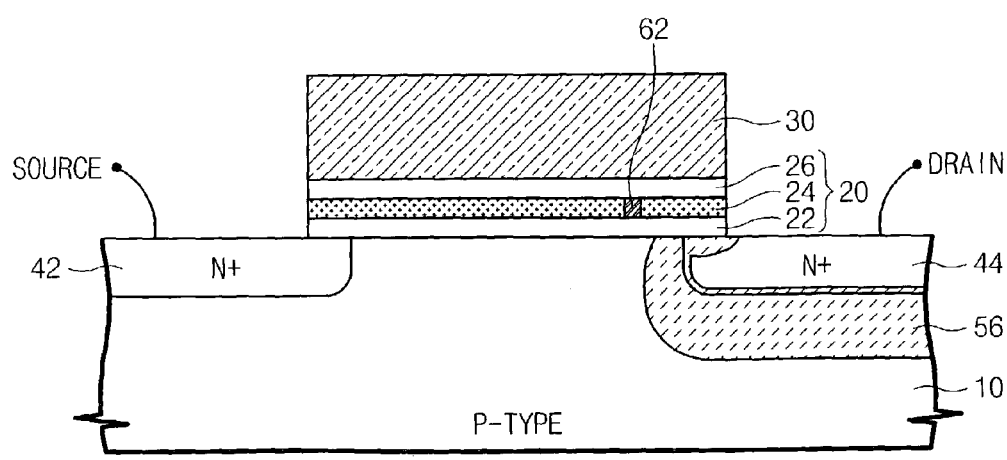
Figure 3:
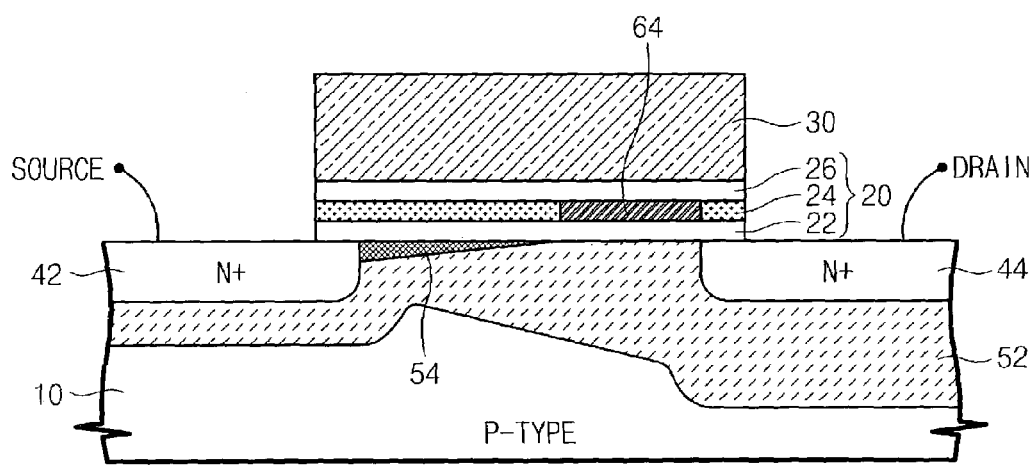
Figure 4:
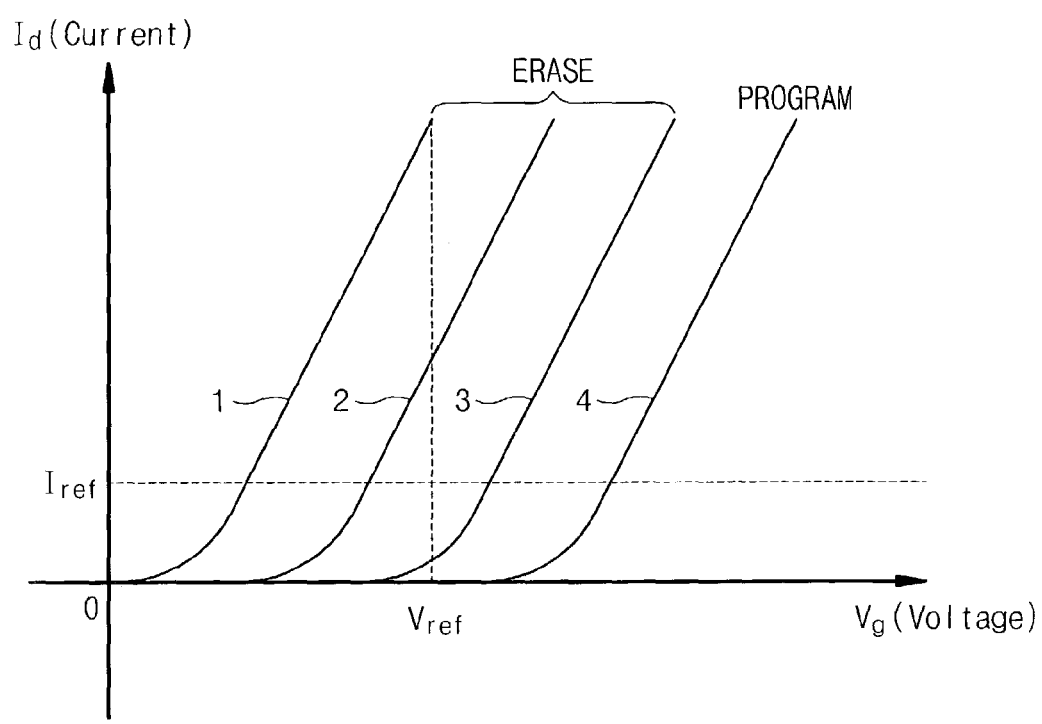
FIG. 4 shows a non-volatile memory device having a SONOS structure in accordance with the prior art.

The present invention will be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or semiconductor substrate, it can be directly on the other layer or semiconductor substrate, or intervening layers may also be present. Like numbers refer to like elements throughout.

FIGS. 5 through 9 are cross-sectional views showing steps of fabricating a non-volatile memory device in accordance with a preferred embodiment of the present invention.

Figure 5:
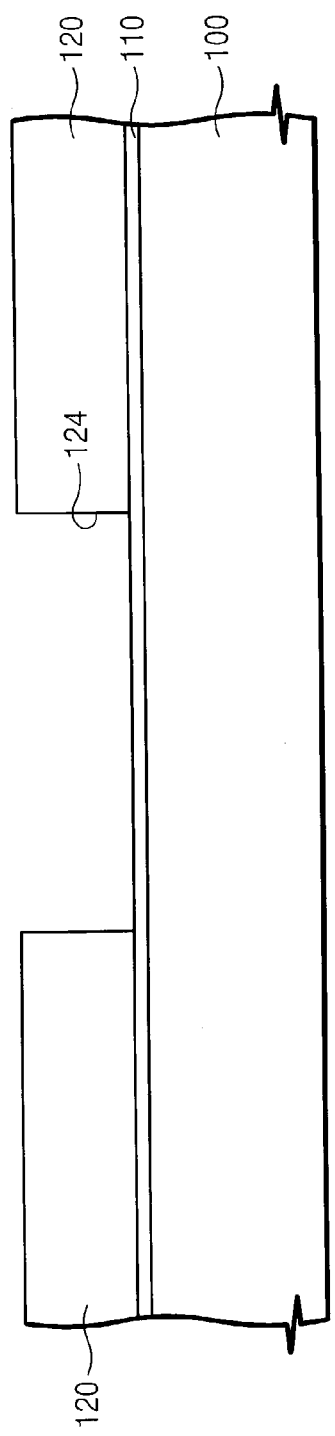

Referring to FIG. 5, an isolating layer (not shown) is formed in a semiconductor substrate 100 having impurities of a first conductivity type to define an active region. A lower insulating layer 110 and first photoresist patterns 120, which are sequentially stacked, are formed on the active region.

Conventionally, the semiconductor substrate 100 mostly uses p-type single crystalline silicon containing an acceptor as impurities. The lower insulating layer 110 is preferably a silicon oxide layer which is formed by thermal oxidation.

The first photoresist patterns 120 have an opening 124 that exposes a top surface of the lower insulating layer 110.

The opening 124 forms a shape of a line crossing over the isolating layer. The opening 124 defines a tunnel insulating layer, a lightly doped region and a heavily doped region that may be formed in subsequent processes.

Figure 6:
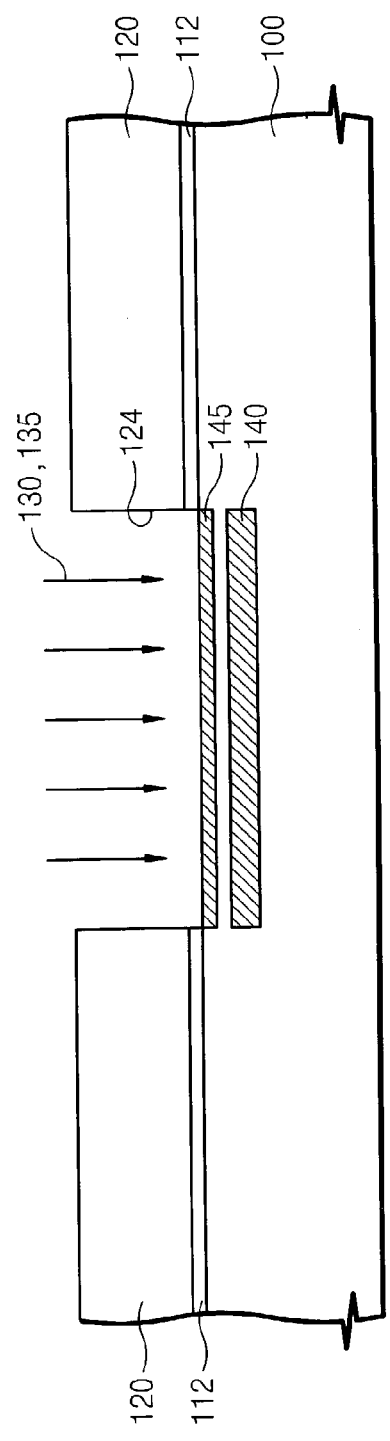

Referring to FIG. 6, the lower insulating layer 110 is etched using the first photoresist patterns 120 as an etching mask to form lower insulating patterns 112 exposing the semiconductor substrate 100.

A tunnel insulating layer is formed on a surface of the exposed semiconductor substrate 100. The tunnel insulating layer affects the electrical characteristics of a cell transistor through a subsequent process. Therefore, etching for forming the lower insulating patterns 112 is preferably performed by an isotropic etching process to prevent the surface of the exposed semiconductor substrate 100 from being attacked. The etching process is preferably carried out using silicon oxide etching recipe having etching selectivity with respect to the semiconductor substrate 100, for example an etch recipe including fluoric acid.

Using the first photoresist patterns 120 as an implantation mask, a low concentration ion implantation 130 and a high concentration ion implantation 135 are performed to form a lightly doped region 145 and a heavily doped region 140 of a first conductivity type in the semiconductor substrate 100. The low and high concentration ion implantations 130 and 135 for forming the lightly and heavily doped regions 145 and 140 are preferably performed before the lower insulating layer 110 is etched. In this case, the lower insulating layer 110 exposed through the opening 124 is used as a buffer layer for minimizing an ion channeling and lattice defects. However, the ion implantations for forming the lightly and heavily doped regions 145 and 140 may be performed after the lower insulating layer 110 is etched.

The lightly doped region 145 is formed to adjust a threshold voltage of a cell transistor. For this, the low concentration ion implantation 130 is performed to distribute the impurities at the surface of the semiconductor substrate 100.

The heavily doped region 140 is formed to minimize a punchthrough that occurs when an inverse high voltage is applied to a drain region of a cell transistor. In this case, to minimize the punchthrough, a depletion region is preferably expanded as little as possible. Thus, the high concentration ion implantation 135 is performed with a higher impurity concentration than that of the low concentration ion implantation 130, thereby forming the heavily doped region 140 to surround a lower sidewall of a drain region that will be formed in a subsequent process. The p-type lightly doped region 140 also causes band-to-band tunneling (BTBT) at a drain region. In this case, the lightly and heavily doped regions 145 and 140 are formed to include impurities of an identical conductivity type with that of the semiconductor substrate 100, e.g., a p-type impurity.

Referring to FIG. 7, after forming the lightly and heavily doped regions 145 and 140, the first photoresist patterns 120 are removed to expose the lower insulating patterns 112.

Preferably, a cleaning for removing residues on the lower insulating pattern 112 and the lightly doped region 145 is further performed. The lower insulating pattern 112 is recessed during the cleaning, so that the thickness thereof may become thinner.

Afterward, a tunnel insulating layer 114 is formed on a top surface of the exposed lightly doped region 145. The tunnel insulating layer 114 is preferably made of silicon oxide which is formed through a thermal oxidation process and made to a thickness thinner than that of the lower insulating pattern 112. The silicon oxide layer may be formed on a top of the exposed lower insulating pattern 112. Therefore, the lower insulating patterns 112 become thicker than that of the tunnel insulating layer 114. A step of forming the lower insulating layer 110 is preferably carried out in due consideration of a recess in a cleaning process and an additional growth in a process of forming the tunnel insulating layer 114.

A charge storage layer 150, an upper insulating layer 160 and a gate conductive layer 170 are sequentially stacked on an entire surface of the semiconductor substrate including the tunnel insulating layer 114. Second photoresist pattern 125 for forming a gate pattern is formed on the gate conductive layer 170.

The charge storage layer 150 is formed of silicon nitride. The charge storage layer 150 is preferably formed by a nitrification process or a chemical vapor deposition (CVD) process that are applied to the lower insulating pattern 112 and the tunnel insulating layer 114. The nitrification process includes a step of annealing an oxide layer using $N_2O$ or NO gases to form a nitride layer on the oxide layer. In addition, the charge storage layer 150 may be formed of silicon oxynitride.

The upper insulating layer 160 is preferably formed of silicon oxide and may be formed of a multi-layer comprising silicon oxide and silicon nitride or a high-k dielectric layer. In addition, the gate conductive layer 170 is preferably made of a polysilicon layer and may be formed of a polysilicon layer and a silicide layer which are sequentially stacked.

The second photoresist pattern 125 is used as an etching mask for forming a gate pattern. Therefore, the second photoresist pattern 125 cross over the device isolating layers and preferably lies over the lower insulating pattern 112 and the tunnel insulating layer 114 and parallel to the removed first photoresist pattern 120. Preferably, all the second photoresist patterns 125 overlap the tunnel insulating layer 114 having an identical width.

Referring to FIG. 8, the gate conductive layer 170 is etched using the second photoresist pattern 125 as an etching mask to form control gate electrodes 175. Etching for forming the control gate electrode 175 is preferably performed by an anisotropic etching process.

Next, the upper insulating layer 160 and the charge storage layer 150 are successively etched to form an upper insulating pattern 165 and a charge storage pattern 155 which expose the lower insulating pattern 112 and the tunnel insulating layer 114.

Subsequently, the lower insulating pattern 112 and the tunnel insulating layer 114 are etched to expose the semiconductor substrate 100. Thus, the tunnel insulating layer 114 is etched to a form tunnel insulating pattern 116 exposing the lightly doped region 145 of a first conductivity type. In this case, the lower insulating pattern 112 and the tunnel insulating pattern 116 are parallel to each other and interposed between the charge storage pattern 155 and the semiconductor substrate 100. A gate pattern 300 comprises the control gate electrode 175, the upper insulating pattern 165, the charge storage pattern 155, the lower insulating pattern 112 and the tunnel insulating pattern 116.

Using the second photoresist pattern 125 as an ion implantation mask, a low concentration ion implantation 180 is performed to form a lightly doped region 190 of a second conductivity type in the semiconductor substrate 100. The lightly doped region 190 of the second conductivity type makes source/drain regions of a cell transistor have a lightly doped drain (LDD) structure. The low concentration ion implantation 180 may be performed before etching for forming the tunnel insulating pattern 116, the charge storage pattern 155 or the upper insulating pattern 165. In this case, material layers 116, 112, 155 or 165 remaining between the control gate electrodes 175 serve as a buffer layer to reduce an ion channeling and lattice defects.

After forming the lightly doped region 190 of the second conductivity type, the second photoresist pattern 125 is removed to expose a top surface of the control gate electrode 175.

Figure 9:
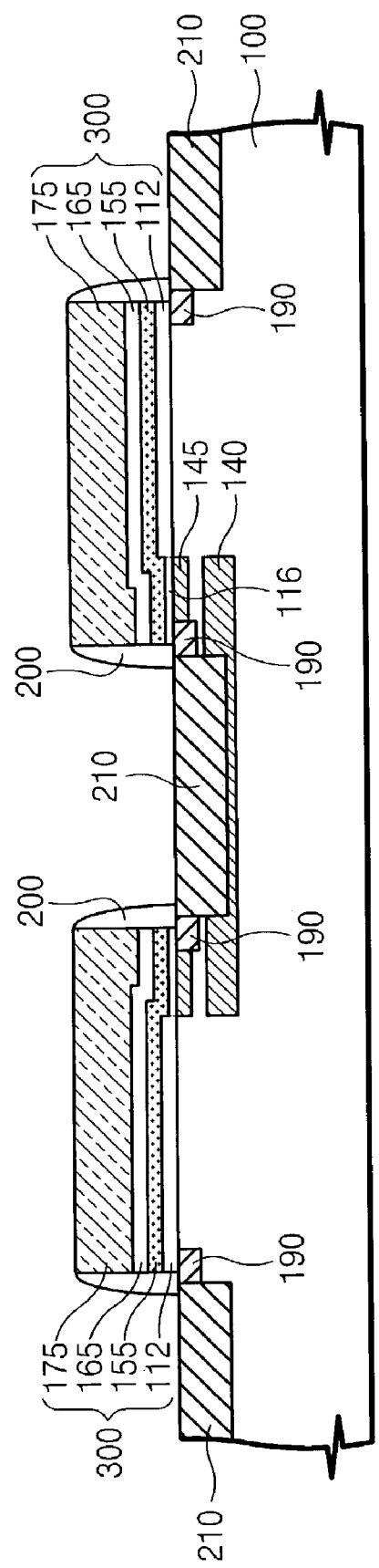

Referring to FIG. 9, spacers 200 exposing a top surface of the semiconductor substrate 100 are preferably formed on sidewalls of the gate patterns 300. In this case, the spacers 200 are preferably formed of a silicon oxide or a silicon nitride.

Using the spacers 200 and the gate pattern 300 as an ion implantation mask, a high concentration ion implantation for forming heavily doped region is carried out to form a heavily doped region 210 of a second conductivity type in the exposed semiconductor substrate 100. The lightly and heavily doped regions 190 and 210 of a second conductivity type constitute source/drain regions of LDD structure.

In addition, after forming the heavily doped region 210, a thermal process may be further performed to activate implanted impurities.

Figure 10:
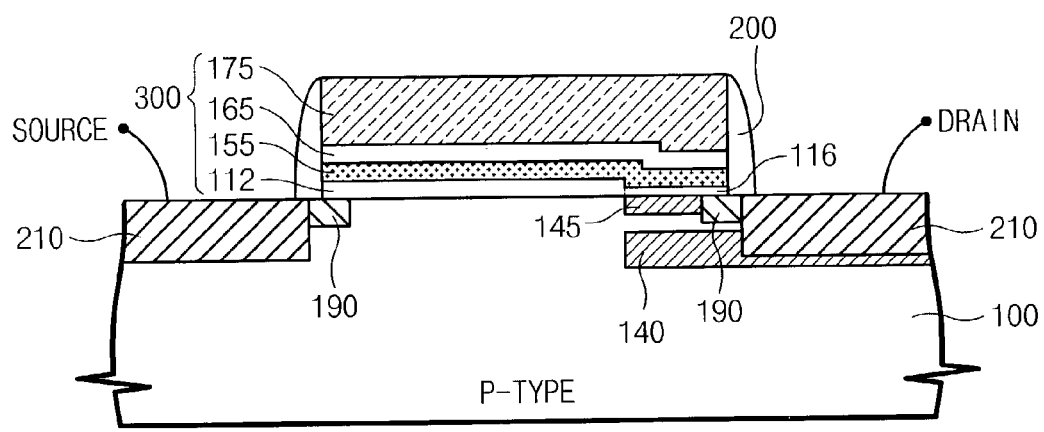
FIG. 10 is a cross-sectional view showing a memory device according to a preferred embodiment of the present invention.

FIG. 10 is a cross-sectional view showing a non-volatile memory device in accordance with a preferred embodiment of the present invention.

Referring to FIG. 10, a charge storage pattern 155, an upper insulating pattern 165 and a control gate electrode 175, which are sequentially stacked, are disposed on a semiconductor substrate 100 containing impurities of a first conductivity type.

The charge storage pattern 155 is preferably a silicon nitride layer or may be a silicon oxynitride layer. The upper insulating pattern 165 is preferably made of silicon oxide or may be a multi-layer comprising silicon oxide and silicon nitride, a high-k dielectric layer or the like. The control gate electrode 175 is preferably formed of a single layer of polysilicon or multiple layers of polysilicon and silicide that are sequentially stacked.

A lower insulating pattern 112 and a tunnel insulating pattern 116 are interposed between the charge storage pattern 155 and the semiconductor substrate 100. The tunnel insulating pattern 116 is thinner than the lower insulating pattern 112 and is disposed parallel to the lower insulating pattern 112. Thus, the control gate electrode 175 is placed over the lower insulating pattern 112 and the tunnel insulating pattern 116 with parallel to the lower insulating pattern 112. In this case, the control gate electrode 175, the upper insulating pattern 165, the charge storage pattern 155, the lower insulating pattern 112 and the tunnel insulating pattern 116 constitute a gate pattern 300.

Spacers 200 are disposed on sidewalls of the gate pattern 300. A heavily doped region 210 of a second conductivity type is disposed in the semiconductor substrate 100 beside the spacers 200. The heavily doped region 210 serves as source/drain regions of a cell transistor. The tunnel insulating pattern 116 is disposed to adjoin the drain region. The lower insulating pattern 112 is disposed to adjoin the source region. That is, an insulating layer under the charge storage pattern 155 is thinner on the drain region than on the source region.

Lightly and heavily doped regions 145 and 140 of the first conductivity type are disposed under the tunnel insulating pattern 116. In addition, a lightly doped region 190 of second conductivity type is interposed between the lightly doped region 145 of the first conductivity type and the heavily doped region 210 of the second conductivity type. The lightly doped region 145 of first conductivity type is disposed at the surface of the semiconductor substrate 100 to contact the tunnel insulating pattern 116. In addition, the heavily doped regions 140 of the first conductivity type are disposed to a predetermined depth from top surface of the semiconductor substrate 100, thereby surrounding lower sidewall of the heavily doped region 210 of the second conductivity type in the drain region.

The lightly and heavily doped regions 145 and 140 of a first conductivity type include impurities of an identical conductivity type with that of the semiconductor substrate 100. The lightly and heavily doped regions 190 and 210 of a second conductivity type include impurities of a different conductivity type from the semiconductor substrate 100.

According to uses or electrical properties of semiconductor devices, the lightly doped region 190 of the second conductivity type or the lightly doped region 145 of the first conductivity type may not be disposed. In addition, the upper insulating pattern 165, the charge storage pattern 155, the lower insulating pattern 112, the tunnel insulating pattern 116 and the like may be wider than the control gate electrodes 175.

Figure 11:
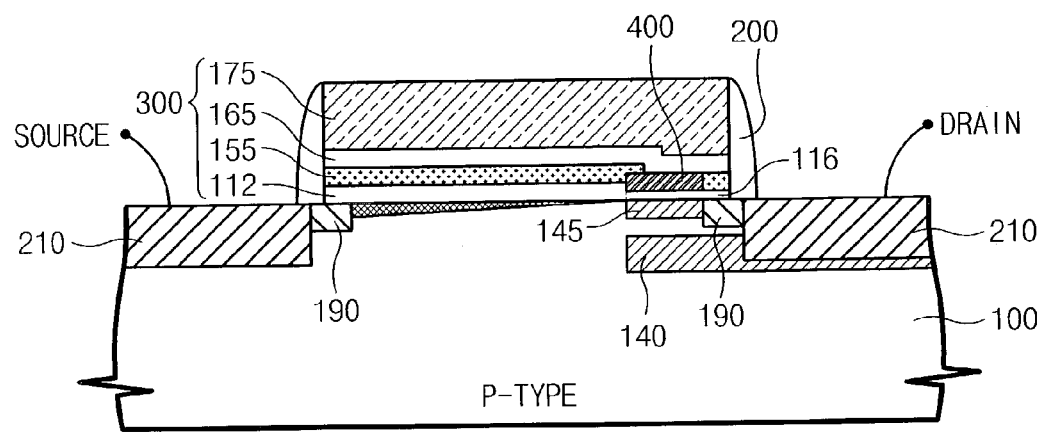
FIG. 11 shows operating properties of the non-volatile memory device according to another preferred embodiment of the present invention.

FIG. 11 shows operating method of a non-volatile memory device in accordance with a preferred embodiment of the present invention illustrated in FIG. 10.

Referring to FIG. 11, according to a preferred embodiment of the present invention, a non-volatile memory device provides a lower insulating pattern 112 and a tunnel insulating pattern 116, which are disposed under a charge storage pattern 155, have different thickness to each other. That is, the tunnel insulating pattern 116 adjoining a drain region is thinner than the lower insulating pattern 112 adjoining a source region.

The programming and erasing employ a phenomenon that charges penetrate the tunnel insulating pattern 116 at peripheral region of the drain region. Energy sufficient to surmount a potential barrier or a quantum mechanical tunneling enables a charge penetration. This charge penetration is proportional to a voltage applied to the control gate electrode 175. Therefore, according to the properties of the present invention (e.g., a decrease of a thickness of the tunnel insulating pattern 116), the programming and erasing of a memory device can be performed with a decreased voltage. Thus, a pumping circuit for increasing a voltage may not be needed.

In addition, a voltage applied to the control gate electrode 175 during the programming can be adjusted for charges to penetrate the tunnel insulating pattern 116 but not to penetrate the lower insulating pattern 112. Accordingly, a trapping region 400 comprising charges implanted during the programming may be protected from an extension due to an imperfect erasing. Namely, a voltage applied to the control gate electrode 175 during a programming can be adjusted to form the trapping region 400 only at the tunnel insulating pattern 116 but not to be extended to the lower insulating pattern 112. As a result, even though the erasing is incompletely performed, the trapping region 400 is formed only at the tunnel insulating pattern 116.

When a high voltage is applied to the drain region (e.g., during the erasing), a width of a depletion region formed in the semiconductor substrate 100 is decreased by the heavily doped region 140 of a first conductivity type. When the width of the depletion region decreases, a band gap between the heavily doped regions 140 and 210 of first and second conductivity types also decreases. Thus, a band-band tunneling easily occurs. Electron-hole pairs (EHPs) are generated by an ion impact of charges implanted into the heavily doped region of first conductivity type by the band-to-band tunneling. Holes generated from the ion impact are mostly ejected through the semiconductor substrate 100. However, some holes form hot holes having energy sufficient to surmount a potential barrier of the tunnel insulating pattern 116 when a sufficiently low voltage is applied to the control gate electrode 175. The erasing utilizes a hot hole erase which offsets electrons of the trapping region 400 with the hot holes. Desired operating voltages for the hot hole erase are a negative voltage (e.g., about −7.5V) to the control gate electrode 175 and a positive voltage (e.g., about 6.5V) to the drain region.

In addition, the heavily doped region 140 of first conductivity type prevents a punch through phenomenon between source/drain regions.

The tunnel insulating pattern 116 is formed to a thickness less than that of the lower insulating pattern 112. Thus, when a voltage is applied through the control gate electrode 175, the semiconductor substrate 100 is inverted faster under the tunnel insulating pattern 116. Accordingly, cell transistor of the present invention has a threshold voltage $V_{th}$ lower than that of a cell transistor having only the lower insulating pattern 112. The lightly doped region 145 of the first conductivity type compensates the decrease of the threshold voltage.

According to another embodiment of the present invention, an insulating layer under a charge storage layer is formed to a non-planar thickness. In other words, a lower insulating pattern adjoining source region is formed to a thickness thinner than that of a tunnel insulating pattern adjoining a drain region. Therefore, during the programming and erasing, a voltage applied to a control gate electrode can be decrease. As a result, the number of pumping circuits is reduced and non-volatile memory devices can be highly integrated. In addition, a trapping region, which is implanted during the programming, is prevented from being extended to the lower insulating pattern. Thus, it is feasible to fabricate non-volatile memory devices having the above described properties.

According to another embodiment of the present invention, a non-volatile memory device includes a heavily doped region which has impurities of an opposite conductivity type with the drain region. The heavily doped region is disposed beside the drain region. Therefore, during an erasing, a depletion region adjacent to the drain region becomes narrow to easily create band-to-band tunneling. As a result, hot holes used for erasing are easily formed, so that efficiency of the erasing can be increased.

Having thus described the invention with the details and particularity required by the patent laws, it is noted that modifications and variation can be made by persons skilled in the art in light of the above teachings. It is therefore to be understood that changes may be made in the particular embodiments of the invention disclosed which are within the scope and spirit of the invention as defined by the appended claims.

What is claimed is:

1. A non-volatile memory device comprising:
   a semiconductor substrate of a first conductivity type;
   a charge storage layer, an upper insulating layer and a control gate electrode which are sequentially stacked on the semiconductor substrate;
   a lower insulating pattern and a tunnel insulating pattern, wherein the lower insulating pattern and the tunnel insulating pattern are interposed between the charge storage layer and the semiconductor substrate;
   a heavily doped region of the first conductivity type which is formed in the semiconductor substrate under the tunnel insulating pattern and spaced apart from an upper surface of the semiconductor substrate at a predetermined distance below the upper surface, wherein the tunnel insulating pattern is thinner than the lower insulating pattern in thickness and disposed at the side of the lower insulating pattern, and wherein the charge storage layer is a silicon nitride layer; and
   a lightly doped region formed in the surface of the semiconductor substrate, wherein the lightly doped region has the first conductivity type and is formed under the tunnel insulating pattern.

2. The device as recited in claim 1, further comprising source/drain regions of a second conductivity type which are formed in the semiconductor substrate on opposite sides of the control gate electrode.

3. The device as recited in claim 2, wherein the source/drain regions have a lightly doped drain structure.

4. The device as recited in claim 2, wherein the tunnel insulating pattern is disposed adjoining the drain region.

5. The device as recited in claim 2, wherein the heavily doped region of the first conductivity type completely surrounds a lower side of the drain region.

6. The device as recited in claim 1, wherein the lower insulating pattern is a silicon oxide layer.

7. The device as recited in claim 1, wherein the upper insulating layer is a silicon oxide layer or a high-k dielectric layer.

8. A non-volatile memory device comprising:
   a lower insulating pattern and a tunnel insulating pattern interposed between a gate pattern and a semiconductor substrate of a first conductivity type wherein the tunnel insulating pattern is thinner than the lower insulating pattern in thickness and is disposed at a side of the lower insulating pattern;
   a first heavily doped region of the first conductivity type which is formed in the semiconductor substrate, wherein the first heavily doped region is disposed at a predetermined distance below an upper surface of the substrate, and wherein the heavily doped region is spaced apart from the upper surface and a portion of the heavily doped region is under the tunnel insulating pattern; and
   a first lightly doped region of the first conductivity type disposed above the first heavily doped region in the substrate such that a surface of the first lightly doped region is substantially even with a surface of the substrate and a space is formed between the first lightly doped region and the first heavily doped region.

9. The device of claim 8, further comprises drain/source regions of a second conductivity type disposed in the substrate on opposite sides of the gate pattern.

10. The device of claim 9, wherein the drain region comprises:
    a second lightly doped region of a second conductivity type disposed in the substrate within an area of the first lightly doped region such that a portion of the second lightly doped region is under a portion of the tunnel insulating pattern.

11. The device of claim 10, wherein the drain region further comprises a second heavily doped region of a second conductivity type formed in the substrate adjacent to the gate pattern, wherein a lower portion of the second heavily doped region is surrounded by the first heavily doped region.

12. A non-volatile memory device comprising:
a semiconductor substrate of a first conductivity type;
a charge storage layer, an upper insulating layer and a control gate electrode which are sequentially stacked on the semiconductor substrate;
a lower insulating pattern and a tunnel insulating pattern, wherein the lower insulating pattern and the tunnel insulating pattern are interposed between the charge storage layer and the semiconductor substrate;
a heavily doped region of the first conductivity type which is formed in the semiconductor substrate under the tunnel insulating pattern and spaced apart from an upper surface of the semiconductor substrate at a predetermined distance below the upper surface, wherein the tunnel insulating pattern is thinner than the lower insulating pattern in thickness; and
a lightly doped region formed in the surface of the semiconductor substrate, wherein the lightly doped region has the first conductivity type and is formed under the tunnel insulating pattern.

* * * * *